United States Patent
Ho et al.

(10) Patent No.: US 9,911,893 B2
(45) Date of Patent: Mar. 6, 2018

(54) METHOD FOR MANUFACTURING A POLYCRYSTALLINE SILICON INGOT

(71) Applicant: AUO Crystal Corporation, Taichung (TW)

(72) Inventors: Kuo-Chen Ho, Taichung (TW); Ya-Lu Tsai, Taichung (TW); Chien-Chia Tseng, Taichung (TW); Chia-Ying Yang, Taichung (TW)

(73) Assignee: AUO CRYSTAL CORPORATION, Taichung (TW)

( * ) Notice: Subject to any disclaimer, the term of this patent is extended or adjusted under 35 U.S.C. 154(b) by 132 days.

(21) Appl. No.: 14/818,798

(22) Filed: Aug. 5, 2015

(65) Prior Publication Data

US 2016/0043266 A1 Feb. 11, 2016

(30) Foreign Application Priority Data

Aug. 7, 2014 (TW) .............................. 103127059 A

(51) Int. Cl.
*H01L 31/18* (2006.01)
*C30B 29/06* (2006.01)
*C30B 11/00* (2006.01)

(52) U.S. Cl.
CPC .......... *H01L 31/182* (2013.01); *C30B 11/002* (2013.01); *C30B 11/003* (2013.01); *C30B 11/006* (2013.01); *C30B 29/06* (2013.01); *Y02E 10/546* (2013.01); *Y02P 70/521* (2015.11)

(58) Field of Classification Search
CPC ... H01L 31/182; C30B 11/002; C30B 11/003; C30B 11/006
USPC .................................................. 423/349–350
See application file for complete search history.

(56) References Cited

U.S. PATENT DOCUMENTS

| | | | | |
|---|---|---|---|---|
| 2007/0006916 | A1* | 1/2007 | Kaneko | C30B 11/001 136/261 |
| 2011/0303143 | A1* | 12/2011 | Lan | C30B 11/002 117/81 |
| 2013/0028825 | A1* | 1/2013 | Tsuzukihashi | C01B 33/02 423/348 |

FOREIGN PATENT DOCUMENTS

| | | |
|---|---|---|
| CN | 102644108 A | 8/2012 |
| CN | 103556222 A | 2/2014 |
| CN | 103882517 A | 6/2014 |
| JP | 2011201736 A | 10/2011 |

OTHER PUBLICATIONS

Machine translation for JP 2011/201,736, Oct. 2011.*
Taiwanese Office Action dated Aug. 13, 2015 for Appln. No. 103127059.

* cited by examiner

*Primary Examiner* — Ngoc-Yen Nguyen
(74) *Attorney, Agent, or Firm* — Pillsbury Winthrop Shaw Pittman LLP

(57) ABSTRACT

A method for manufacturing a polycrystalline silicon ingot includes steps of: a) melting a silicon material in a container disposed in a thermal field to form a molten silicon; b) controlling the thermal field to provide heat to the molten silicon from above the container and to solidify a portion of the molten silicon contacting a base part and at least a portion of a wall part proximate to the base part of the container to form a solid silicon crystalline isolation layer; and c) controlling the thermal field to continuously provide heat to the rest of the molten silicon from above the container and to solidify the rest of the molten silicon gradually from a bottom to a top of the rest of the molten silicon to form a polycrystalline silicon ingot.

16 Claims, 8 Drawing Sheets

METHOD FOR MANUFACTURING A POLYCRYSTALLINE SILICON INGOT

CROSS-REFERENCE TO RELATED APPLICATION

This application claims priority of Taiwanese Application No. 103127059, filed on Aug. 7, 2014.

FIELD

This disclosure relates to a method for manufacturing a silicon ingot, and more particularly to a method for manufacturing a polycrystalline silicon ingot.

BACKGROUND

A polycrystalline silicon wafer applied in a conventional polycrystalline silicon solar cell is typically formed by cutting a polycrystalline silicon ingot. The manufacture of the polycrystalline silicon ingot is carried out by heating a silicon material in a crucible to obtain molten silicon, which is then cooled down and allowed to condense so as to form the polycrystalline silicon ingot.

A polycrystalline silicon wafer of a solar cell having low resistance and high photoelectric conversion efficiency may be manufactured by adding boron as a dopant during a polycrystalline silicon ingot growing process. However, if a high concentration of oxygen impurity is present during the polycrystalline silicon ingot growing process, the solar cell manufactured thereby may form boron-oxygen defect after light illumination so that the photoelectric conversion efficiency may be reduced.

The crucible for forming the polycrystalline silicon ingot is made of quartz and may release oxygen impurity from the wall thereof at high temperature. The oxygen impurity released from the wall of the crucible may blend into the molten silicon, especially a portion of the molten silicon proximate to the wall of the crucible. In order to solve the aforesaid problem, it is disclosed in, for example, JP 2001-198648 to form a silicon nitride ($Si_3N_4$) layer on an inner surface of the crucible so as to easily release the formed polycrystalline silicon ingot from the crucible and to inhibit blending of the oxygen impurity into the molten silicon. However, it is demonstrated that there is still the oxygen impurity diffusing through the silicon nitride layer and blending into the molten silicon. Therefore, the concentration of the oxygen impurity in the molten silicon may not be effectively reduced merely by the silicon nitride layer.

There is thus a need in the art to provide a method to reduce the concentration of the oxygen impurity blended in the polycrystalline silicon ingot to a satisfactory extent so as to permit the polycrystalline silicon ingot to be suitable for manufacturing a polycrystalline silicon wafer of a solar cell having low resistance and high photoelectric conversion efficiency.

SUMMARY

Therefore, an object of this disclosure is to provide a method for manufacturing a polycrystalline silicon ingot containing a relatively reduced amount of oxygen impurity.

A method for manufacturing a polycrystalline silicon ingot according to this disclosure includes steps of:

a) melting a silicon material in a container disposed in a thermal field to form a molten silicon, wherein the container includes a base part and a wall part extending upward from a periphery of the base part;

b) controlling the thermal field to provide heat to the molten silicon from above the container and to solidify a portion of the molten silicon contacting the base part and at least a portion of the wall part proximate to the base part of the container to form a solid silicon crystalline isolation layer to isolate at least a lower portion of the rest of the molten silicon from the container; and c) controlling the thermal field to continuously provide heat to the rest of the molten silicon from above the container and to solidify the rest of the molten silicon gradually from a bottom to a top of the rest of the molten silicon to form a polycrystalline silicon ingot.

In the method for manufacturing a polycrystalline silicon ingot according to this disclosure, the thermal filed is controlled to solidify a portion of the molten silicon contacting the base part and at least a portion of the wall part proximate to the base part of the container to form a solid silicon crystalline isolation layer so as to inhibit diffusion of oxygen impurity into the rest of the molten silicon. Therefore, the polycrystalline silicon ingot formed thereby contains a relatively reduced amount of the oxygen impurity.

BRIEF DESCRIPTION OF THE DRAWINGS

Other features and advantages of this disclosure will become apparent in the following detailed description of the embodiment with reference to the accompanying drawings, of which.

DETAILED DESCRIPTION

Figure 1:
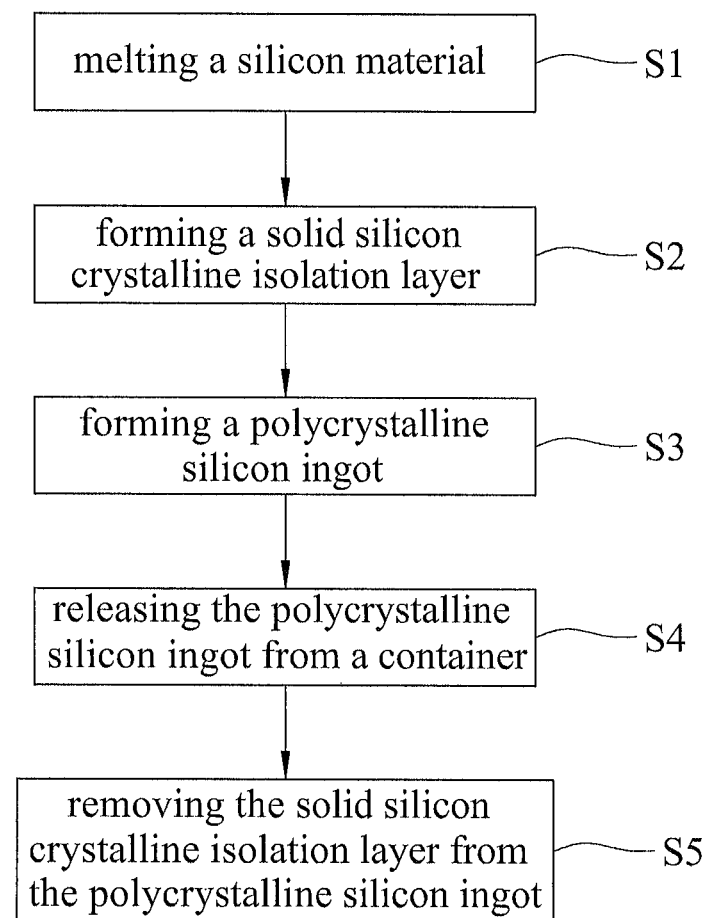
FIG. 1 is a flow diagram illustrating an embodiment of a method for manufacturing a polycrystalline silicon ingot according to this disclosure.

Referring to FIG. 1, an embodiment of a method for manufacturing a polycrystalline silicon ingot according to this disclosure includes steps of: S1) melting a silicon material, S2) forming a solid silicon crystalline isolation layer, S3) forming a polycrystalline silicon ingot, S4) releasing the polycrystalline silicon ingot from a container, and S5) removing the solid silicon crystalline isolation layer from the polycrystalline silicon ingot.

Figure 2:
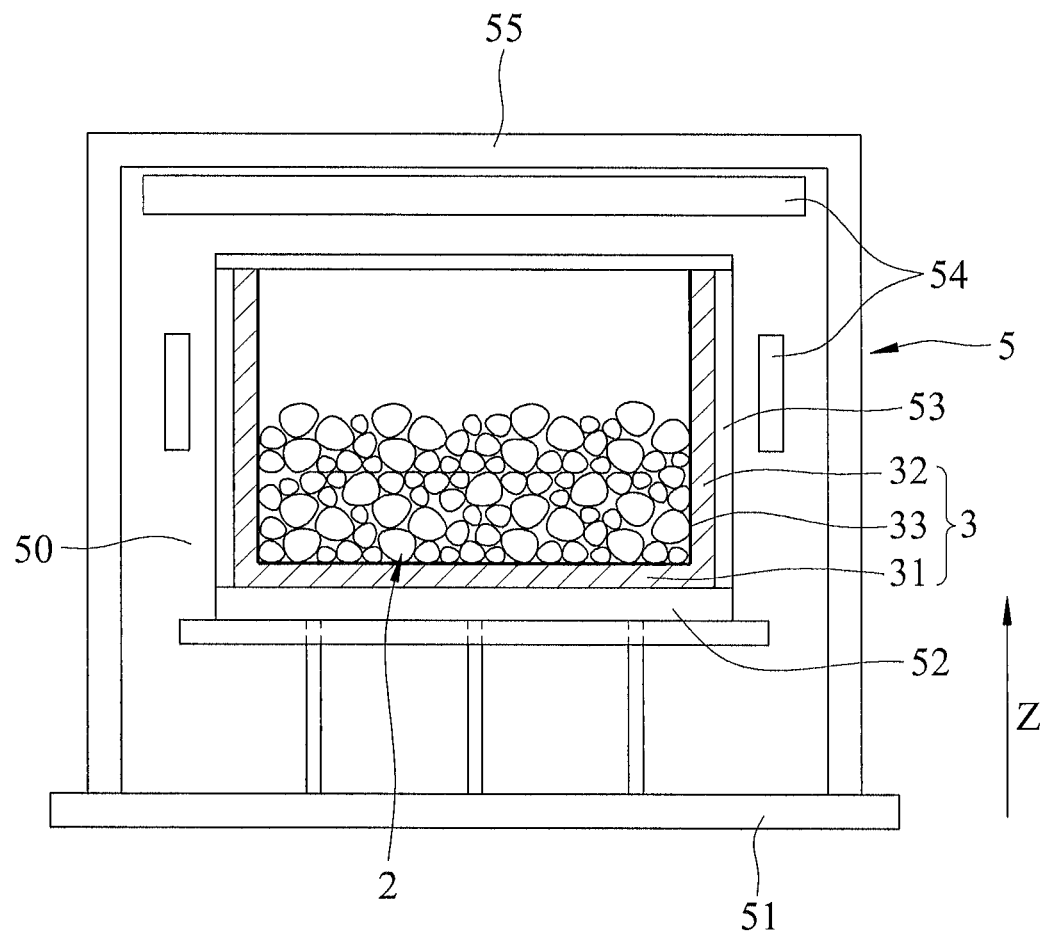
FIG. 2 is a schematic view illustrating a crystal growth furnace system for performing the embodiment of the method of this disclosure in which a crucible for containing a silicon material is mounted.
Figure 3:
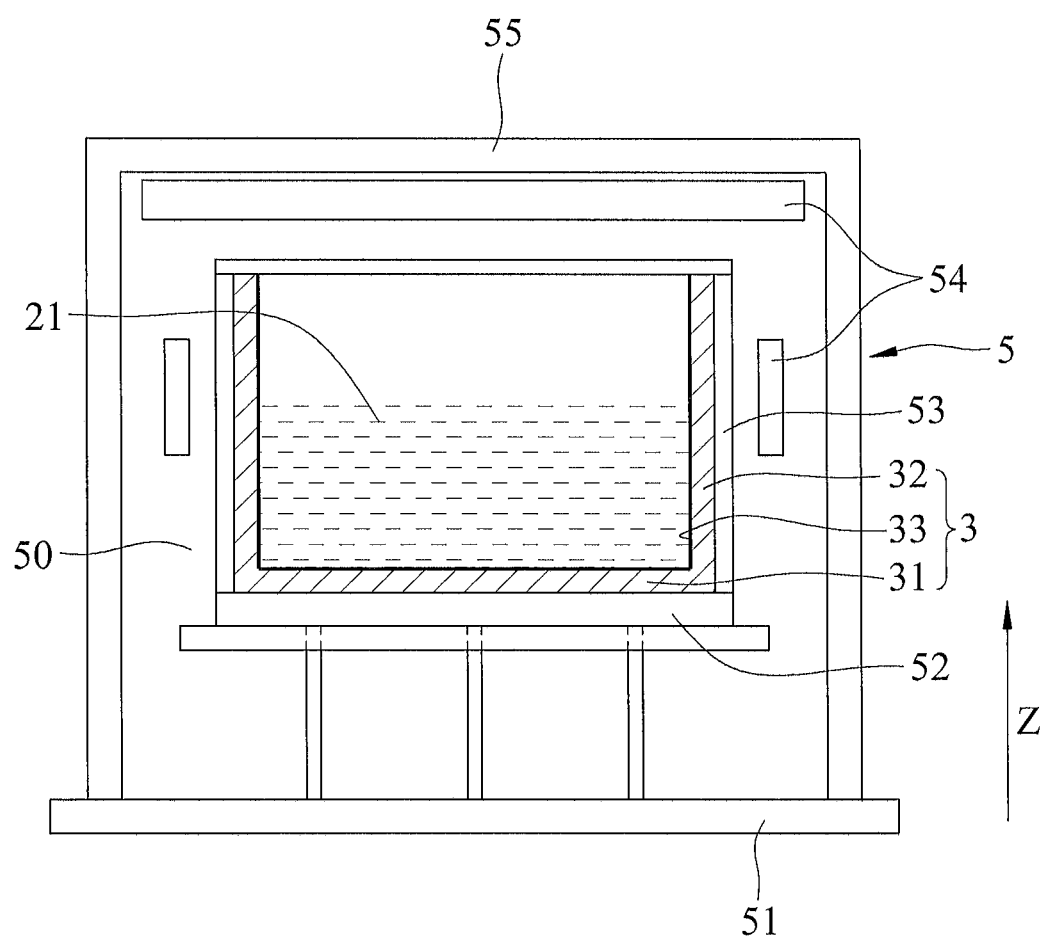
FIG. 3 is a schematic view illustrating the crystal growth furnace system in a state in which a step of melting the silicon material of the embodiment of the method of this disclosure is performed.

Referring to FIGS. 2 and 3, in step S1), a silicon material 2 is contained in a container 3, which is a crucible in the embodiment. The container 3 includes a base part 31, a wall part 32 extending upward from a periphery of the base part 31, and a release layer 33 formed on inner surfaces of the base part 31 and the wall part 32. The container 3 is disposed in a thermal field 50 defined within a crystal growth furnace system 5. The silicon material 2 contained in the container 3 is heated and molten by the thermal field 50 to form a molten silicon 21, best shown in FIG. 3.

Preferably, the release layer 33 is made from a silicon nitride material. The crystal growth furnace system 5 includes a heat insulation base 51, a heat conductive seat 52 disposed above the heat insulation base 51, a heat insulation wall 53 made of a graphite material and extending upward from the heat conductive seat 52 to surround the container 3, two heaters 54 respectively mounted above the container 3 and around the heat insulation wall 53, and a heat insulation shield 55 disposed above the heat insulation base 51 and movable in a longitudinal direction (Z). The heat insulation shield 55 covers the container 3 and the heaters 54.

The thermal field 50 defined within the crystal growth furnace system 5 has a temperature distribution determined by the temperature raising and/or reducing conditions of the heaters 54 and a moving extent of the heat insulation shield 55 moving in the longitudinal direction (Z).

Figure 4:
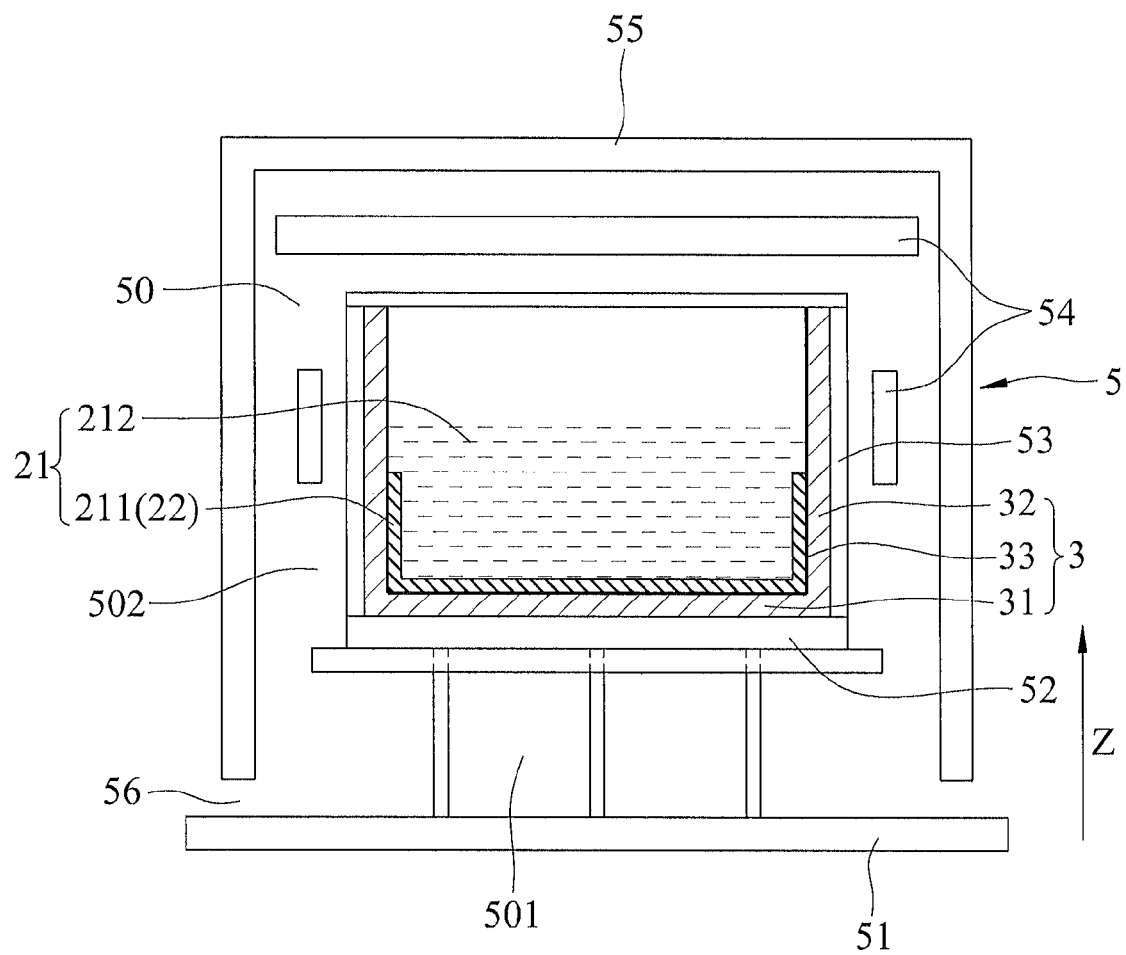
FIG. 4 is a schematic view illustrating the crystal growth furnace system in a state in which a step of forming a solid silicon crystalline isolation layer of the embodiment of the method of this disclosure is performed.

Referring to FIG. 4, in step S2), the thermal field 50 is controlled so as to provide heat to the molten silicon 21 from above and on the side of the container 3 (i.e., from the heaters 54). The heating temperature of the thermal field 50 is 17-25° C. lower than a melting point (1412° C.) of the silicon material 2 (see FIG. 2). At the same time, the thermal field 50 is controlled to decrease the temperature of a first portion 501 of the thermal field 50 below the base part 31 of the container 3 and the temperature of a second portion 502 of the thermal field 50 outside the portion of the wall part 32 proximate to the base part 31 of the container 3 simultaneously so as to decrease the temperature of a portion 211 of the molten silicon 21 contacting the base part 31 and the portion of the wall part 32 proximate to the base part 31 of the container 3 to form a solid silicon crystalline isolation layer 22 which isolates at least a lower portion of the rest 212 of the molten silicon 21 from the container 3.

Preferably, step S2) is performed at a temperature ranging from 1387° C. to 1395° C. for about 13.5 hours.

Specifically, the crystal growth furnace system 5 is operated to permit the heat insulation shield 55 to move upward in the longitudinal direction (Z) so as to form a gap 56 between a lower end of the heat insulation shield 55 and a top surface of the heat insulation base 51. Ambient air may be introduced into the heat insulation shield 55 via the gap 56 so as to dissipate the heat of the portion 211 of the molten silicon 21 out of the container 3 via the base part 31 and at least the portion of the wall part 32 proximate to the base part 31. Therefore, the temperature of the portion 211 of the molten silicon 21 contacting the base part 31 and at least the portion of the wall part 32 proximate to the base part 31 is reduced so as to solidify the portion 211 of the molten silicon 21.

More specifically, in the embodiment of the method for manufacturing a polycrystalline silicon ingot of this disclosure, the temperature distribution of the thermal field 50 in step S2) is defined by setting the temperature raising conditions of the heaters 54 and by moving the heat insulation shield 55 upward in the longitudinal direction (Z) at the same time. In the embodiment, the height of the gap 56 from the heat insulation base 51 is defined as a cage position. The cage position is positively proportional to the amount of the ambient air introduced into the heat insulation shield 55. In other words, the cage position is positively proportional to a heat dissipation rate. The cage position is in a range preferably from 6.0 cm to 8.5 cm, and more preferably from 6.0 cm to 7.0 cm.

Notably, in addition to the aforesaid manner to control the temperature distribution of the thermal field 50, the temperature distribution of the thermal field 50 may be controlled by other manners as long as the solid silicon crystalline isolation layer 22 may be formed to isolate at least a lower portion of the rest 212 of the molten silicon 21 from the container 3. For example, a cooling circuit or other cooling devices may be installed within the heat insulation shield 55 or the heating temperature of the heaters 54 may be decreased to control the temperature distribution of the thermal field 50.

Preferably, a first height (H) defined between the base part 31 of the container 3 and a top surface of the molten silicon 21 and a second height (h) defined between the base part 31 of the container 3 and a top end of the solid silicon crystalline isolation layer 22 satisfy a relationship of h≤0.8H.

Figure 5:
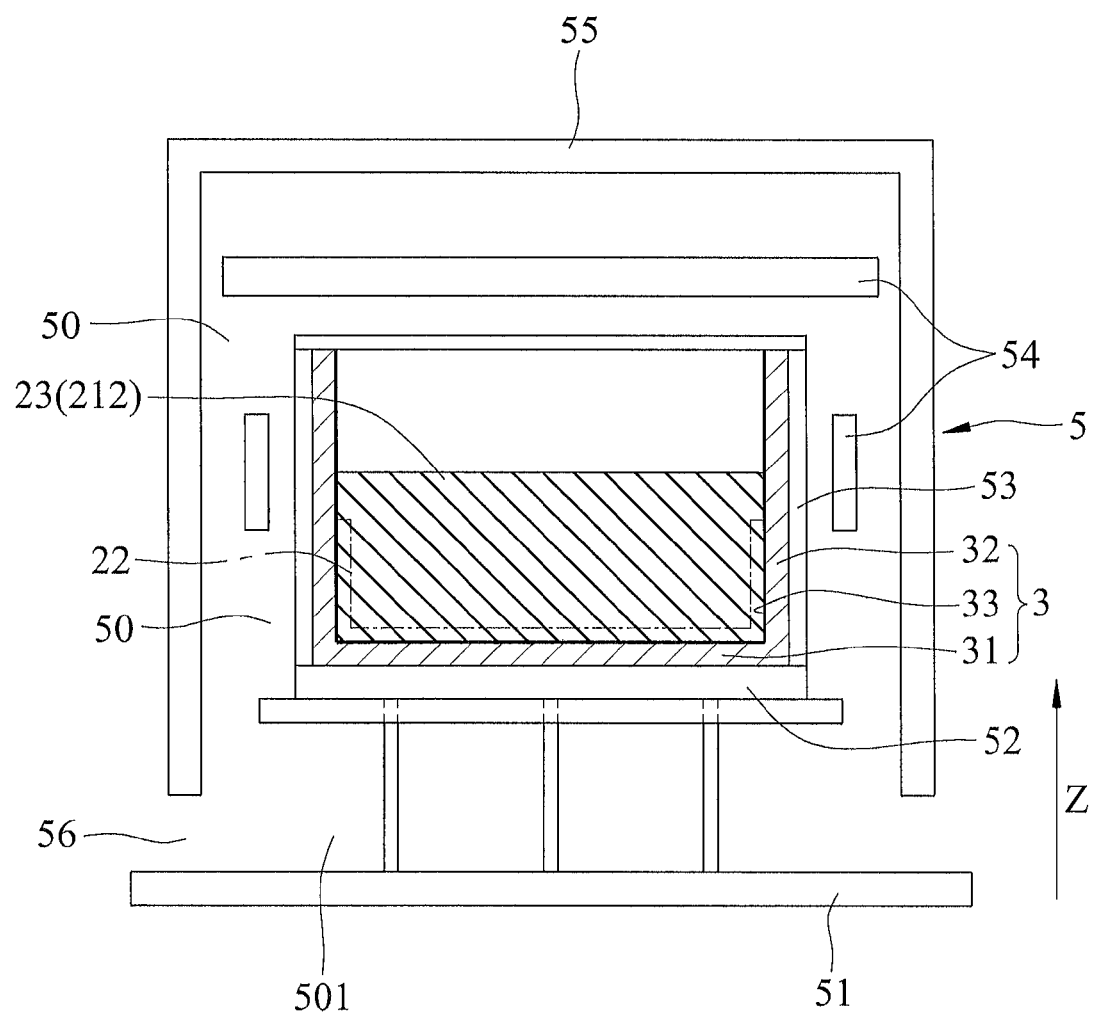
FIG. 5 is a schematic view illustrating the crystal growth furnace system in a state in which a step of forming a polycrystalline silicon ingot of the embodiment of the method of this disclosure is performed.

In step S3), the thermal field 50 is controlled to continuously provide heat to the rest 212 of the molten silicon 21 from above and on the side of the container 3 (i.e., from the heaters 54), and the heating temperature of the thermal field 50 in step S3) is controlled to be not higher than the heating temperature of the thermal field 50 in step S2). At the same time, the temperature of the first portion 501 of the thermal field 50 below the base part 31 of the container 3 is decreased continuously so as to solidify the rest 212 of the molten silicon 21 gradually from a bottom to a top of the rest 212 of the molten silicon 21 to form a polycrystalline silicon ingot 23 (see FIG. 5).

Preferably, step S3) is performed at 1387° C. for about 7.5 hours.

Specifically, the crystal growth furnace system 5 is operated to permit the heat insulation shield 55 to move further upward in the longitudinal direction (Z) so as to adjust the cage position. Ambient air may be continuously introduced into the heat insulation shield 55 via the gap 56 so as to dissipate the heat of the rest 212 of the molten silicon 21 out of the container 3 via the base part 31 of the container 3. Therefore, the temperature of the rest 212 of the molten silicon 21 is decreased from the bottom of the rest 212 of the molten silicon 21 so as to solidify the rest 212 of the molten silicon 21 gradually from the bottom to the top of the rest 212 of the molten silicon 21 to form the polycrystalline silicon ingot 23.

More specifically, in the embodiment of the method for manufacturing a polycrystalline silicon ingot of this disclosure, the temperature distribution of the thermal field 50 in step S3) is defined by setting the temperature raising conditions of the heaters 54 (i.e. to be not higher than the heating temperature of the thermal field 50 in step S2)) and by moving the heat insulation shield 55 further upward in the longitudinal direction (Z) at the same time.

Figure 6:
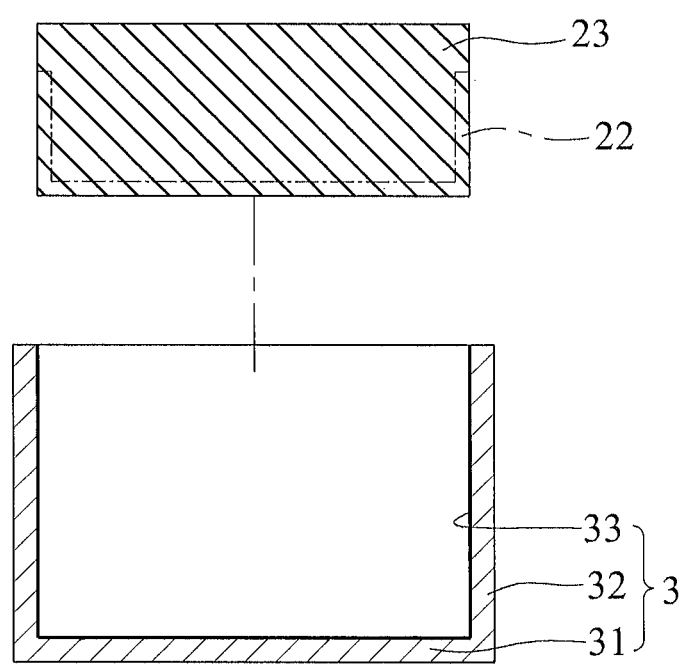
FIG. 6 is a schematic view illustrating a step of releasing the polycrystalline silicon ingot from the crucible of the embodiment of the method of this disclosure.

Referring to FIG. 6, in step S4), the polycrystalline silicon ingot 23 formed with the solid silicon crystalline isolation layer 22 is released from the container 3.

Referring to FIG. 4 again, since oxygen impurities may be introduced from the container 3 into the portion 211 of the molten silicon 21 during solidification of the portion 211 of the molten silicon 21 to form the solid silicon crystalline isolation layer 22, the concentration of the oxygen impurities in the solid silicon crystalline isolation layer 22 is larger than the concentration of the oxygen impurities in the portion of the polycrystalline silicon ingot 23 other than the solid silicon crystalline isolation layer 22 after the polycrystalline silicon ingot 23 is formed. When a polycrystalline silicon ingot is used to make a solar cell, photoelectric conversion efficiency of the solar cell may be disadvantageously affected by the oxygen impurities contained in the polycrystalline silicon ingot. Therefore, it is desirable for the solid silicon crystalline isolation layer 22 to be separated from the polycrystalline silicon ingot 23 so as to enhance the photoelectric conversion efficiency of the solar cell made from the polycrystalline silicon ingot 23.

Figure 7:
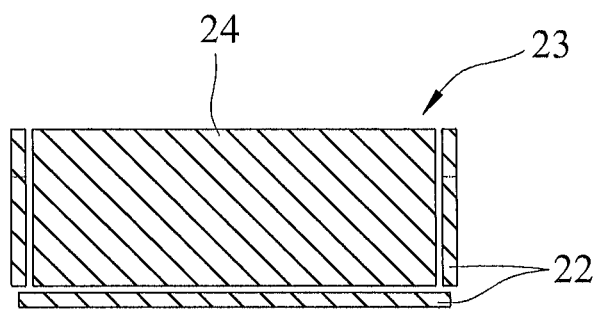
FIG. 7 is a schematic view illustrating a step of removing the solid silicon crystalline isolation layer from the polycrystalline silicon ingot of the embodiment of the method of this disclosure.

Referring to FIG. 7, in step S5), the solid silicon crystalline isolation layer 22 is separated from the polycrystalline silicon ingot 23 to obtain a polycrystalline silicon ingot product 24.

Specifically, the solid silicon crystalline isolation layer 22 is cut longitudinally and transversely during squaring of the polycrystalline silicon ingot 23 so as to separate the solid silicon crystalline isolation layer 22 from the polycrystalline silicon ingot 23 to obtain the polycrystalline silicon ingot product 24.

The process parameters of Concrete Examples 1-4 of the embodiment of the method for manufacturing a polycrystalline silicon ingot of this disclosure and Comparative Example 1 are shown in Table 1.

lattices of the polycrystalline silicon ingot to absorb infrared light and to vibrate so as to obtain absorption spectra corresponding to different elements contained in the polycrystalline silicon ingot. The oxygen concentration in the polycrystalline silicon ingot was calculated based on the peak value of the absorption spectrum. As shown in Table 1, in Comparative Example 1, the oxygen concentration obtained at 40 mm from the bottom of the polycrystalline silicon ingot is 9.93 ppma. In Concrete Examples 1-4, the oxygen concentrations obtained at 40 mm from the bottom of the polycrystalline silicon ingots range from 0.58 ppma to 7.32 ppma, and are significantly lower than that obtained in Comparative Example 1.

Figure 8:
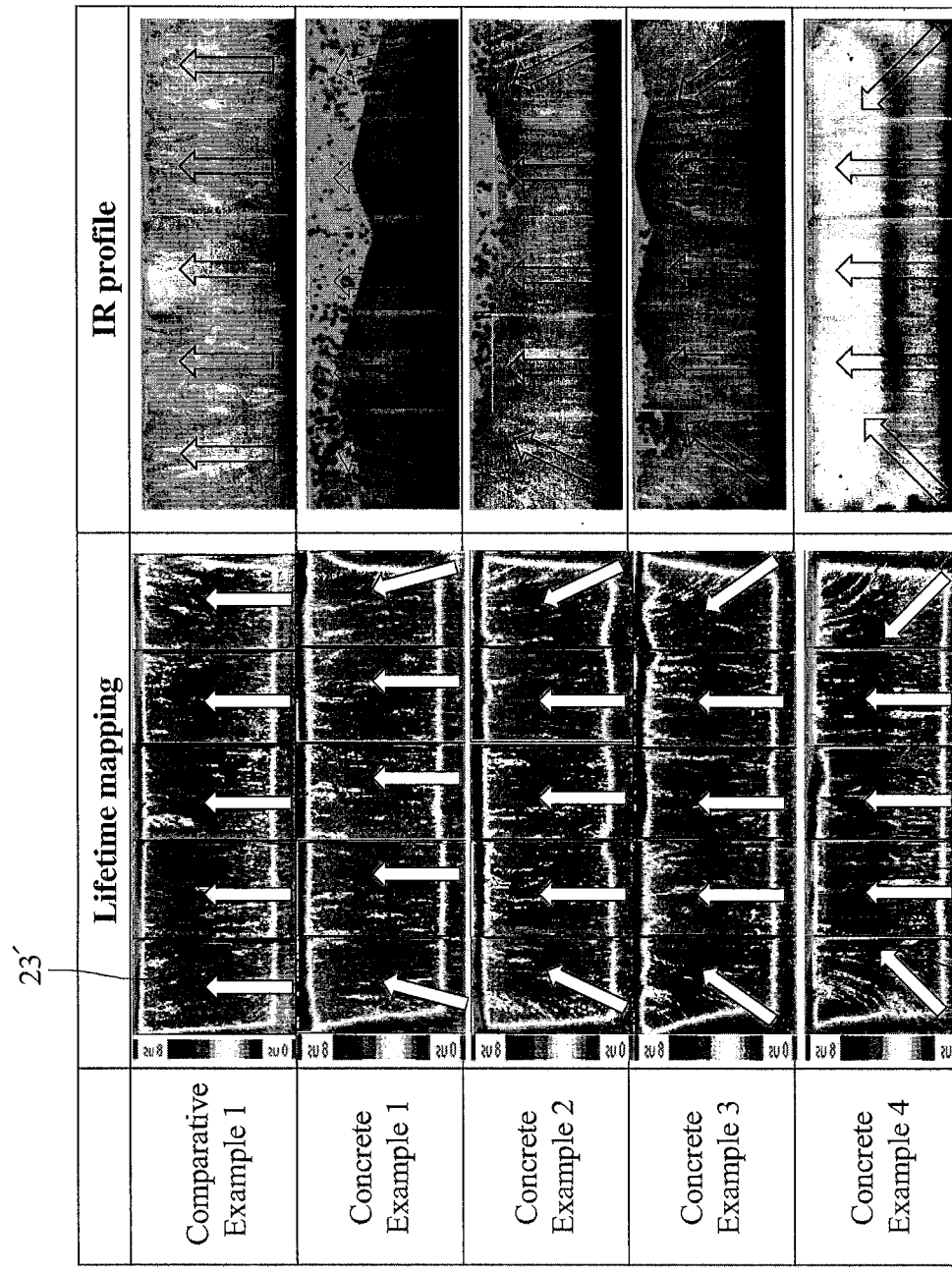
FIG. 8 illustrates minority carrier lifetime mappings and infrared profiles of the polycrystalline silicon ingots manufactured by concrete examples of the embodiment of the method of this disclosure and by a comparative example.

Referring to FIG. 8, the minority carrier lifetime mappings of the polycrystalline silicon ingots manufactured in Concrete Examples 1-4 and Comparative Example 1 are illustrated in the left column, and the infrared profiles of the polycrystalline silicon ingots manufactured in Concrete Examples 1-4 and Comparative Example 1 are illustrated in the right column. As shown in FIG. 8, it is clearly demonstrated that the solid silicon crystalline isolation layer 22 is formed in each of the polycrystalline silicon ingots 23 manufactured in Concrete Examples 1-4. However, the polycrystalline silicon ingot 23' manufactured in Comparative Example 1 is not formed with the solid silicon crystalline isolation layer 22.

The minority carrier lifetime mappings illustrated in the left column of FIG. 8 were obtained by using a Microwave Photoconductivity Decay (µ-PCD) measurement technique.

TABLE 1

| Stage | Comparative Example 1 | | | Concrete Example 1 | | | Concrete Example 2 | | | Concrete Example 3 | | | Concrete Example 4 | | |
|---|---|---|---|---|---|---|---|---|---|---|---|---|---|---|---|
| | Time (hr) | Temp. (° C.) | C.P.* (cm) | Time (hr) | Temp. (° C.) | C.P. (cm) | Time (hr) | Temp. (° C.) | C.P. (cm) | Time (hr) | Temp. (° C.) | C.P. (cm) | Time (hr) | Temp. (° C.) | C.P. (cm) |
| G1 | 2 | 1400 | 7 | 7.5 | 1395 | 6.6 | 7.5 | 1391 | 6.4 | 7.5 | 1389 | 6.2 | 7.5 | 1387 | 6.0 |
| G2 | 2.5 | 1403 | 9 | 6 | 1395 | 8.5 | 6 | 1391 | 8.0 | 6 | 1389 | 7.3 | 6 | 1387 | 7.0 |
| G3 | 3 | 1401 | 11 | 4.5 | 1387 | 8.5 | 4.5 | 1387 | 8.5 | 4.5 | 1387 | 8.5 | 4.5 | 1387 | 8.5 |
| G4 | 3 | 1398 | 15 | 3 | 1387 | 10 | 3 | 1387 | 10 | 3 | 1987 | 10 | 3 | 1387 | 10 |
| Oxygen at Bottom** | 9.93 ppma | | | 7.32 ppma | | | 3.36 ppma | | | 2.01 ppma | | | 0.58 ppma | | |

*Cage Position
**Oxygen Concentration at a bottom of a polycrystalline silicon ingot In Table 1, Stages G1 and G2 correspond to the aforesaid step S2), and Stages G3 and G4 correspond to the aforesaid step S3). In Stages G1 and G2, as compared to Comparative Example 1, the heating temperatures of the heaters 54 in Concrete Examples 1-4 were controlled to be relatively low and the cage positions in Concrete Examples 1-4 were controlled to be relatively small so as to reduce heat dissipation rate and to extend the process times in Stages G1 and G2. Therefore, the solid silicon crystalline isolation layer 22 may be sufficiently formed in Concrete Examples 1-4. Additionally, in Stages G3 and G4, as compared to Comparative Example 1, the heating temperatures of the heaters 54 in Concrete Examples 1-4 were also controlled to be relatively low and the cage positions in Concrete Examples 1-4 were also controlled to be relatively small so as to control the crystal growth rate of the polycrystalline silicon ingot 23 to be about 1 cm/hr.

The oxygen concentration of each of the polycrystalline silicon ingots obtained in Concrete Example 1-4 and Comparative Example 1 was measured using a Fourier transform infrared (FTIR) spectrometer. The polycrystalline silicon ingot was excited under infrared illumination to permit the Specifically, minority carriers in a polycrystalline silicon ingot are excited using microwave to separate and then recombine. Conductivity of the polycrystalline silicon ingot varying during a process time period is measured, and minority carrier lifetime may be calculated from the time required for the minority carries from separation to recombination. The longer the minority carrier lifetime, the better the quality of the polycrystalline silicon ingot.

As shown in Table 1 and FIG. 8, it is demonstrated that when a thermal field having a crystal growth temperature lower than that used in a conventional process is used in a crystal growth process, a solid silicon crystalline isolation layer may be formed before a polycrystalline silicon ingot is manufactured. The solid silicon crystalline isolation layer may inhibit diffusion of oxygen impurity from a container (for example, a crucible) into the rest of molten silicon. The oxygen impurities contained in the portion of a polycrystalline silicon ingot formed from the rest of the molten silicon may be effectively reduced.

In view of the above, in the method for manufacturing a polycrystalline silicon ingot of this disclosure, a thermal field for a crystal growth process is controlled by using a heating temperature of 17-25° C. lower than a melting point of a silicon material. A portion of molten silicon contacting a base part and at least a portion of a wall part proximate to the base part of a container may be solidified to form a solid silicon crystalline isolation layer before the polycrystalline silicon ingot is manufactured. The solid silicon crystalline isolation layer may inhibit diffusion of oxygen impurity from a container (for example, a crucible) into the rest of molten silicon. The oxygen impurities contained in the portion of a polycrystalline silicon ingot formed from the rest of molten silicon may be effectively reduced.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for manufacturing a polycrystalline silicon ingot, comprising steps of:
   a) melting a silicon material in a container disposed in a thermal field to form a molten silicon, wherein the container includes a base part and a wall part extending upward from a periphery of the base part;
   b) controlling the thermal field to provide heat to the molten silicon from above the container and to solidify a portion of the molten silicon contacting the base part and at least a portion of the wall part proximate to the base part of the container to form a solid silicon crystalline isolation layer which surrounds at least a lower portion of the rest of the molten silicon to isolate the lower portion of the rest of the molten silicon from the container; and
   c) controlling the thermal field to continuously provide heat to the rest of the molten silicon from above the container and to solidify the rest of the molten silicon gradually from a bottom to a top of the rest of the molten silicon to form a polycrystalline silicon ingot.

2. The method according to claim 1, wherein in step b), the temperature of a portion of the thermal field below the base part of the container and the temperature of a portion of the thermal field outside the portion of the wall part proximate to the base part of the container are decreased simultaneously so as to decrease the temperature of the portion of the molten silicon contacting the base part and the portion of the wall part proximate to the base part of the container.

3. The method according to claim 2, wherein in step c), the temperature of the portion of the thermal field below the base part of the container is continuously decreased so as to decrease the temperature of the rest of the molten silicon from the bottom to the top of the rest of the molten silicon to solidify the rest of the molten silicon gradually from the bottom of the rest of the molten silicon.

4. The method according to claim 1, wherein a first height (H) defined between the base part of the container and a top surface of the molten silicon and a second height (h) defined between the base part of the container and a top end of the solid silicon crystalline isolation layer satisfy a relationship of h≤0.8H.

5. The method according to claim 1, wherein the container is formed with a release layer on an inner surface of the base part and the wall part of the container.

6. The method according to claim 5, further comprising steps of:
   d) releasing the polycrystalline silicon ingot formed with the solid silicon crystalline isolation layer from the container; and
   e) removing the solid silicon crystalline isolation layer from the polycrystalline silicon ingot.

7. The method according to claim 5, wherein the release layer is made from a silicon nitride material.

8. The method according to claim 1, wherein in step b), a heating temperature of the thermal field is 17-25° C. lower than a melting point of the silicon material.

9. The method according to claim 1, wherein step b) is performed for about 13.5 hours.

10. The method according to claim 1, wherein step c) is performed for about 7.5 hours.

11. The method according to claim 1, wherein step b) is performed at a temperature raging from 1387° C. to 1395° C.

12. The method according to claim 1, wherein step c) is performed at about 1387° C.

13. The method according to claim 6, wherein step e) is performed by cutting the solid silicon crystalline isolation layer longitudinally and transversely during squaring the polycrystalline silicon ingot so as to separate the solid silicon crystalline isolation layer from the polycrystalline silicon ingot.

14. The method according to claim 1, wherein the thermal field in step c) is controlled at a temperature which is not higher than a temperature at which the thermal field in step b) is controlled.

15. The method according to claim 2, further comprising steps of:
   d) releasing the polycrystalline silicon ingot formed with the solid silicon crystalline isolation layer from the container; and
   e) removing the solid silicon crystalline isolation layer from the polycrystalline silicon ingot.

16. The method according to claim 15, wherein step e) is performed by cutting the solid silicon crystalline isolation layer longitudinally and transversely during squaring the polycrystalline silicon ingot so as to separate the solid silicon crystalline isolation layer from the polycrystalline silicon ingot.

* * * * *